United States Patent [19]

Kumar

[11] Patent Number: 5,709,744
[45] Date of Patent: Jan. 20, 1998

[54] MASKING METHODS DURING SEMICONDUCTOR DEVICE FABRICATION

[75] Inventor: Shiralagi Kumar, Chandler, Ariz.

[73] Assignee: Motorola, Schaumburg, Ill.

[21] Appl. No.: 609,704

[22] Filed: Mar. 1, 1996

[51] Int. Cl.$^6$ .................................... C30B 25/02
[52] U.S. Cl. ............................ 117/95; 117/97
[58] Field of Search .................... 117/2, 95, 97; 437/228 M, 228 SE, 228 SD, 228 CR

[56] References Cited

U.S. PATENT DOCUMENTS 4,717,681   1/1988   Curran ................................ 437/31

OTHER PUBLICATIONS

A.J. Spring Thorpe et al., "Measurement of GaAs Surface Oxide Desorption Temperatures", Appl. Phys. Lett 50 (2), 12 Jan. 1987, 1987 American Inst. of Physics, pp. 77–72.

S. Ingrey, et al., "An X-Ray Photoelectron Spectroscopy Study on Ozone Treated GaAs Surfaces", J. Vac. Sci. Technol, A4 (3) May/Jun. 1986, 1986 Am. Vac. Soc., pp. 984–988.

Primary Examiner—Felisa Garrett
Attorney, Agent, or Firm—Eugene A. Parsons

[57] ABSTRACT

A method of masking surfaces during fabrication of semiconductor devices is disclosed, which includes providing a gallium arsenide substrate. The surface can include a layer of native oxide or not, and a metal mask is positioned adjacent the surface so as to define a growth area and an unmasked portion on the surface. Ultraviolet light is directed at the unmasked area, by exposing the surface to a bright light, so as to grow an oxide film on the unmasked portion of the surface. The metal mask is removed and the oxide film then serves as a mask for further operations and can be easily removed in situ by heating. If native oxide is included, it can be removed in situ by heating the substrate to a lower temperature.

11 Claims, 1 Drawing Sheet

MASKING METHODS DURING SEMICONDUCTOR DEVICE FABRICATION

FIELD OF THE INVENTION

The present invention pertains to the fabrication of semiconductor devices and more specifically to improved masking techniques during semiconductor device fabrication.

BACKGROUND OF THE INVENTION

In the semiconductor field it is common to sequentially grow several different layers of semiconductor material and use various masks and etching steps to form the desired devices and terminals on the devices. In some methods, masking material, e.g. nitride/oxide or the like, is applied and semiconductor material is grown over masked and unmasked areas. The material on the masked areas is then removed by etching and lift-off. In some instances material is selectively grown in unmasked areas and the masking material is then removed. In some processes a photoresist mask is used to define and develop a hard mask, i.e. a metal mask, a nitride mask, etc.

Generally, in these prior art methods of fabricating semiconductor devices, etching is required to remove unwanted material and masks are removed by etching, solvent, or the like. During the etching and/or mask removal processes, the material of the semiconductor device has a high likelihood of being contaminated by the etchant, which contamination greatly reduces the life of the device, the operating characteristics of the device, and the reliability of the device. Further, the etching process severely damages semiconductor material adjacent the etched areas which further reduces life, operating characteristics, and reliability. Also, etching processes are very time consuming and difficult to perform.

Thus, these prior art techniques involve many process steps such as resist spinning, exposure, developing, cleaning and so on. All of these processes can introduce contamination, decrease yield, etc. A further problem that arises is that the structure or substrate (generally a wafer) must be removed from the growth chamber to remove the masking material. The structure is then masked again and reintroduced into the growth chamber for re-growth. Thus, the prior art techniques keep the wafer vacuum incompatible.

In addition to the masking and etching problems, all known prior art fabrication processes require many interspersed growing, masking and etching steps which greatly complicate and lengthen the process. For example, when epitaxial layers are grown, the wafers must be placed in a vacuum or pressure chamber to provide the atmosphere for the growth. Each time the wafer must be etched and/or masked, it must be removed from the chamber, resulting in large amounts of preparation time for each step. Also, each time wafers are removed from a chamber and subsequently replaced, the opening and preparation of the chamber (as well as the processing of the wafer) is an opportunity for additional impurities and contaminants to be introduced to the wafer.

Accordingly, it would be highly desirable to provide fabrication methods for semiconductor devices with improved masking processes.

It is a purpose of the present invention to provide a new and improved method of masking gallium arsenide substrates during semiconductor device fabrication.

It is another purpose of the present invention to provide a new and improved method of masking gallium arsenide substrates during the fabrication of semiconductor devices which does not require removal of the substrate from the processing chamber to remove the mask.

It is still another purpose of the present invention to provide a new and improved method of masking gallium arsenide substrates during the fabrication of semiconductor devices which does not require the introduction of contaminants, such as photoresist, solvents and etchants.

It is a further purpose of the present invention to provide a new and improved method of masking gallium arsenide substrates during the fabrication of semiconductor devices which is much simpler and includes less chance of contamination of the devices.

SUMMARY OF THE INVENTION

The above problems and others are at least partially solved and the above purposes and others are realized in a method of masking surfaces during fabrication of semiconductor devices which includes providing a gallium arsenide substrate, or other III–V compounds, with or without a layer of native oxide thereon. A metal mask is positioned on the surface so as to define a growth area and an unmasked portion on the surface. Ultraviolet light is directed at the unmasked area, by exposing the surface to a bright light, so as to grow an oxide film on the unmasked portion of the surface. The metal mask is removed and the oxide film then serves as a mask for further operations and can be easily removed in situ by heating or dry etching. If native oxide is included, it can be removed in situ by heating the substrate to a lower temperature than is required to desorb the oxide mask.

In a preferred embodiment, the mask positioned on the surface is a hard mask, such as a chrome mask or the like. Further, in the preferred embodiment a bright light is used, such as that present in an aligner or stepper, which bright light preferably includes deep ultraviolet light.

As a specific example, the substrate is then introduced into a growth chamber and may be heated to a first temperature to desorb any native oxide that is present. A crystalline material is selectively grown on the exposed growth area and the substrate is heated to a second higher temperature to desorb the oxide layer in the growth chamber. Thus, semiconductor devices are grown and the mask is removed without taking the substrate from the growth chamber. Also, the oxide layer can be used as an etch mask or for any other semiconductor processes that require masking.

BRIEF DESCRIPTION OF THE DRAWINGS

Referring to the drawings.

DESCRIPTION OF THE PREFERRED EMBODIMENTS

Figure 1:
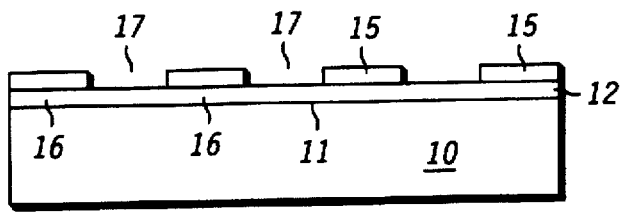
FIGS. 1–4 are simplified sectional views of a substrate illustrating several sequential steps in a masking process in accordance with the present invention.

Turning now to the drawings, FIGS. 1–4 illustrate several steps in a method of masking a gallium arsenide substrate 10, in accordance with the present invention, for the fabrication of semiconductor devices. It should be understood that gallium arsenide substrate 10 is utilized herein for purposes of this description but other III–V compounds and other semiconductor materials may be utilized in other applications. Referring specifically to FIG. 1, a simplified sectional view of gallium arsenide substrate 10 having a surface 11 is illustrated. It should be understood that substrate 10 might simply be a supporting structure, such as a wafer or the like, or it might include various layers formed on or in the supporting structure.

Surface 11 of gallium arsenide substrate 10 has a film 12 (generally 20 angstroms or less) of a native oxide which, as is well known in the art, forms generally instantaneously upon exposure to air. It should be understood that the native oxide is not always necessary to the present invention and is only illustrated because it is generally present and requires special procedures to prevent. In some applications various types of passivation may be used, to prevent the formation of film 12, in which case such passivation may have to be removed before the present procedure can be performed. It has been found that the present technique will operate generally as described with the surface simply being clean (i.e. no foreign matter).

A mask 15 is positioned adjacent to surface 11 of substrate 10 for patterning surface 11, as will be explained presently. Mask 15 generally is a shadow or metal mask but, in some special applications, it can be formed in the well known manner with photolithography as in an aligner or stepper (generally includes a projected image from a mask). As will become apparent presently, one of the major advantages of the present technique is that photolithography and the like are not necessary for the described masking operations. In a preferred embodiment, mask 15 is a mask plate with metal lines and other features, for example, a chrome mask. In any case, mask 15 is positioned adjacent surface 11 so as to define one or more growth areas 16 on surface 11 beneath mask 15 and one or more unmasked portions 17 on surface 11 of substrate 10.

Figure 2:
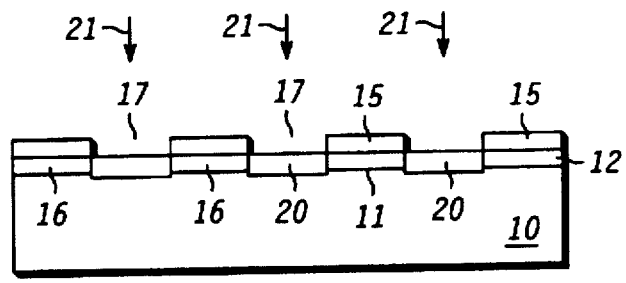

Unmasked portions 17 of surface 11 are exposed to a bright light preferably including deep ultraviolet, represented by arrows 21 in FIG. 2. The bright light may be, for example, the type typically used in aligners, steppers, or E-beam devices in the semiconductor industry. The term "deep ultraviolet" refers to light in the ultraviolet range, generally with a wavelength in the range of 180 to 250 nanometers. In the present specific example, it is believed that the 185 nm light generates ozone due to optical excitation. Therefore, excitation wavelength that is most suitable for efficient ozone generation is also the most efficient to use, although virtually any ultraviolet light will produce the desired result. It is believed that exposure to other wavelengths, such as 248 nm in a specific example, modifies the composition of the surface oxide by forming a different kind of oxide or complex oxide molecules that are more stable than the native oxide. The exposure to light can be performed under a lamp. However, when the light is collimated, as in an aligner or stepper, sharp features can be defined in unmasked portion 17.

In a specific example, a gallium arsenide wafer with a layer of native oxide on the surface was provided. Standard bright lights, both at 185 nm and at 248 nm, were used with the wafer being exposed through a chrome coated mask for 5 minutes. An oxide film with a thickness less than approximately 2 nm was produced in the unmasked areas.

Figure 3:
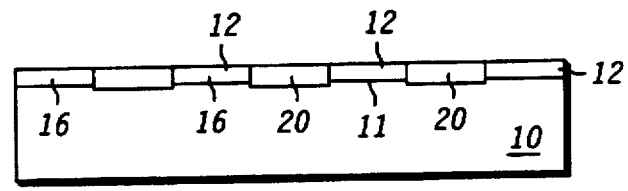
Figure 4:
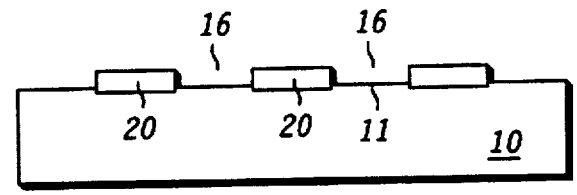

Once oxide film 20 is grown, mask 15 is removed to expose growth areas 16, as illustrated in FIG. 3. Oxide film 20 then serves as a mask for further process operations, such as growth, etching, and so on, and can be easily removed in situ by heating, if necessary. As an example of further operations, substrate 10 is then introduced into a growth chamber (not shown) and heated to a temperature of approximately 580° C. to desorb any native oxide that may still be present in growth areas 16. Substrate 10 with native oxide-free growth areas 16 is illustrated in FIG. 4.

Figure 5:
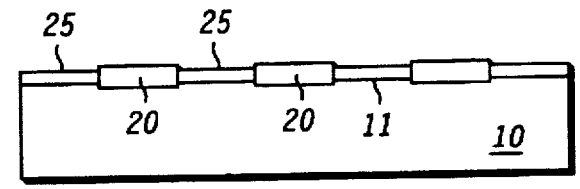
FIG. 5 is a simplified sectional view of the substrate of FIG. 4 with semiconductor material grown on the surface.

While retaining substrate 10 in the growth chamber, selective growth of crystalline, or semiconductor, material 25 in growth areas 16 is performed, as illustrated in FIG. 5. With oxide film 20 in place as a mask for further growth, a predetermined amount of crystalline material 25 is selectively grown in area (or areas) 16. For purposes of this disclosure, "selective growth" or "selectively grown" is defined as growing only in the specific or designated area. In a specific example, selective InAs was selectively grown using trimethyl indium and arsine in a chemical beam epitaxy. Thus, in this example, material 25 grows only in growth areas 16. Further, material 25 generally grows in a crystalline form so that growth rates and shapes are crystallographic dependent, i.e. the rate and shape of growth are dependent upon the type of material 25 being utilized.

Figure 6:
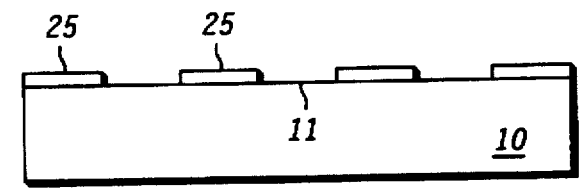
FIG. 6 is a simplified sectional view of the substrate with the mask removed.

Once the desired amount of material 25 is grown in growth areas 16, substrate 10 is heated to a higher temperature (approximately, 640° C.) in the growth chamber to desorb oxide film 20, resulting in the structure illustrated in FIG. 6. Thus, the mask utilized for patterned growth of material 25 is desorbed, or removed, in situ, i.e. without the need to remove substrate 10 from the growth chamber.

Figure 7:
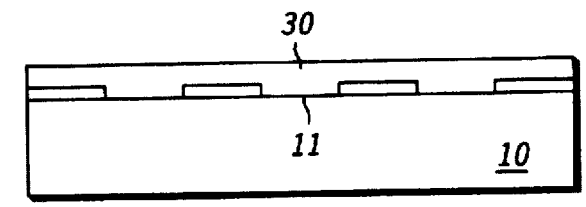
FIG. 7 is a simplified sectional view of the substrate illustrating additional material deposited thereon.

Further growth of material can be performed on crystalline material 25 subsequent to the step of heating substrate 10 to desorb oxide film 20. In a somewhat different process, instead of heating substrate 10 to desorb oxide film 20, triethyl gallium was used to dissolve oxide film 20 and simultaneously produce the growth of a layer of gallium arsenide. As illustrated in FIG. 7, a layer 30 of additional material is grown or deposited on the surface of material 25 and on the exposed surface of substrate 10. Thus, re-growth is performed without having to remove substrate 10 from the growth chamber. It will be apparent to those skilled in the art, after reading this disclosure, that complete semiconductor devices can be formed on substrate 10 without removing it from the growth chamber.

It should also be understood that oxide film 20 can be incorporated into and retained as a portion of some types of semiconductor devices. For example, oxide film 20 can be used as a gate oxide in some insulated gate field effect transistors. In which case oxide film 20 is grown as described above and is then masked to define the gate area, after which a metal layer is formed thereon to define the gate electrode.

Thus, an improved masking processes is disclosed which provides a new and improved method of masking gallium arsenide substrates during semiconductor device fabrication. The new and improved method of masking gallium arsenide substrates includes a simplified method of masking silicon without requiring photoresists, nitride/oxide, and the like. The absence of resist in the process improves resolution limits previously defined by resist thickness. Further, the new process eliminates a number of process steps and, hence, is cheaper, cleaner, improves yield, can result in better resolution and therefore smaller lines, and makes the fabrication process vacuum compatible. Also, the oxide layer can be used as an etch mask or for any other semiconductor processes that require masking.

Because the new and improved method of masking gallium arsenide substrates does not require the introduction and removal of wafers or substrates from processing chambers several times in sequence during the fabrication of semiconductor devices, the fabrication process is much simpler and includes less chance of contamination of the devices. The present novel process allows selective growth and further re-growth, all in-situ, without exposure to air and contamination during the intermediate processing steps between epitaxy, etc. By eliminating air and other contaminant exposure between steps, the novel process ensures good quality in subsequent epitaxial steps While I have shown and described specific embodiments of the present invention, further modifications and improvements will occur to those skilled in the art. I desire it to be understood, therefore, that this invention is not limited to the particular forms shown and I intend in the appended claims to cover all modifications that do not depart from the spirit and scope of this invention.

What is claimed is:

1. A method of masking surfaces during fabrication of semiconductor devices comprising the steps of:

providing a gallium arsenide substrate with a surface to be patterned;

positioning a mask adjacent the surface so as to define a growth area and an unmasked portion on the surface;

directing a bright light onto the unmasked portion of the surface to selectively grow an oxide film on the unmasked portion of the surface;

removing the mask; and using the oxide film on the unmasked portion of the surface as a masking film to fabricate semiconductor devices on the gallium arsenide substrate.

2. A method of masking surfaces during fabrication of semiconductor devices as claimed in claim 1 wherein the step of positioning the mask adjacent the surface includes utilizing a mask plate with metal lines and other features.

3. A method of masking surfaces during fabrication of semiconductor devices as claimed in claim 2 wherein the step of utilizing the mask plate with metal lines includes utilizing a chrome mask.

4. A method of masking surfaces during fabrication of semiconductor devices as claimed in claim 1 wherein the step of positioning the mask adjacent the surface includes utilizing a stepper.

5. A method of masking surfaces during fabrication of semiconductor devices as claimed in claim 1 wherein the step of providing the gallium arsenide substrate with the surface includes providing a gallium arsenide substrate with a surface having a layer of native oxide formed thereon.

6. A method of masking surfaces during fabrication of semiconductor devices as claimed in claim 5 wherein the step of providing the gallium arsenide substrate with the surface having the layer of native oxide formed thereon includes providing a gallium arsenide substrate with a surface having a layer of native oxide formed thereon less than approximately 20 angstroms thick.

7. A method of masking surfaces during fabrication of semiconductor devices as claimed in claim 1 wherein the step of selectively directing the bright light onto the unmasked portion includes selectively directing ultraviolet light onto the unmasked portion.

8. A method of masking surfaces during fabrication of semiconductor devices as claimed in claim 7 wherein the step of selectively directing ultraviolet light onto the unmasked portion includes directing deep ultraviolet light onto the unmasked portion of the surface.

9. A method of masking surfaces during fabrication of semiconductor devices as claimed in claim 7 wherein the step of selectively directing ultraviolet light onto the unmasked portion includes directing ultraviolet light with a wavelength in a range of 180 nm to 250 nm.

10. A method of masking surfaces during fabrication of semiconductor devices comprising the steps of:

providing a gallium arsenide substrate with a surface;

positioning a mask on the surface so as to define a growth area and an unmasked portion on the surface;

directing ultraviolet light onto the unmasked portion of the surface to grow an oxide film on the unmasked portion of the surface;

removing the mask and introducing the substrate into a growth chamber and selectively growing, on the exposed growth area, a crystalline material utilizing the oxide film as a mask; and heating the substrate in the growth chamber to desorb the oxide film.

11. A method of masking surfaces during fabrication of semiconductor devices comprising the steps of:

providing a gallium arsenide substrate with a surface having a native oxide thereon;

positioning a mask on the surface so as to define a growth area and an unmasked portion on the surface;

directing ultraviolet light onto the unmasked portion of the surface to grow an oxide film on the unmasked portion of the surface;

removing the mask and introducing the substrate into a growth chamber and heating the substrate to a first temperature to desorb the native oxide in the growth area;

selectively growing, on the exposed growth area, a crystalline material utilizing the oxide film as a mask; and heating the substrate in the growth chamber to a second temperature higher than the first temperature to desorb the oxide film.

* * * * *

UNITED STATES PATENT AND TRADEMARK OFFICE
CERTIFICATE OF CORRECTION

PATENT NO. : 5,709,744 Page 1 of 1
DATED : January 20, 1998
INVENTOR(S) : Kumar Shiralagi It is certified that error appears in the above-identified patent and that said Letters Patent is hereby corrected as shown below:

<u>Title page,</u>
Item [75], Inventor, "Shiralagi Kumar," should read as -- Kumar Shiralagi. --.

Signed and Sealed this

Twentieth Day of April, 2004

JON W. DUDAS
*Acting Director of the United States Patent and Trademark Office*